United States Patent
Park et al.

(10) Patent No.: US 7,026,208 B2
(45) Date of Patent: Apr. 11, 2006

(54) METHODS OF FORMING INTEGRATED CIRCUIT DEVICES INCLUDING CYLINDRICAL CAPACITORS HAVING SUPPORTERS BETWEEN LOWER ELECTRODES

(75) Inventors: Byung-jun Park, Kyungki-do (KR); Yoo-sang Hwang, Yongin (KR); Hoon Jung, Suwon (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/393,086

(22) Filed: Mar. 20, 2003

(65) Prior Publication Data

US 2003/0178728 A1    Sep. 25, 2003

(30) Foreign Application Priority Data

Mar. 21, 2002    (KR) ............................ 2002-15385

(51) Int. Cl.
*H01L 21/8242*    (2006.01)

(52) U.S. Cl. ..................... 438/239; 438/106

(58) Field of Classification Search ............... 438/239, 438/106
See application file for complete search history.

(56) References Cited

FOREIGN PATENT DOCUMENTS

| KR | 2001-4798 | 1/2001 |
|---|---|---|
| KR | 2001-87943 | 9/2001 |
| KR | 2002-6333 | 1/2002 |

OTHER PUBLICATIONS

Notice to Submit Response issued Feb. 28, 2004 for Korean Application No. 10-2002-0015385.

*Primary Examiner*—Long Pham
(74) *Attorney, Agent, or Firm*—Myers Bibel Sibley & Sajovec, P.A.

(57) ABSTRACT

An integrated circuit device includes a semiconductor substrate that has a cell region and a peripheral region that surrounds the cell region. A plurality of capacitors that include a plurality of lower electrodes, respectively, are disposed in the cell region. Supporters connect adjacent ones of the plurality of lower electrodes to provide structural support and stability to the lower electrodes.

17 Claims, 19 Drawing Sheets

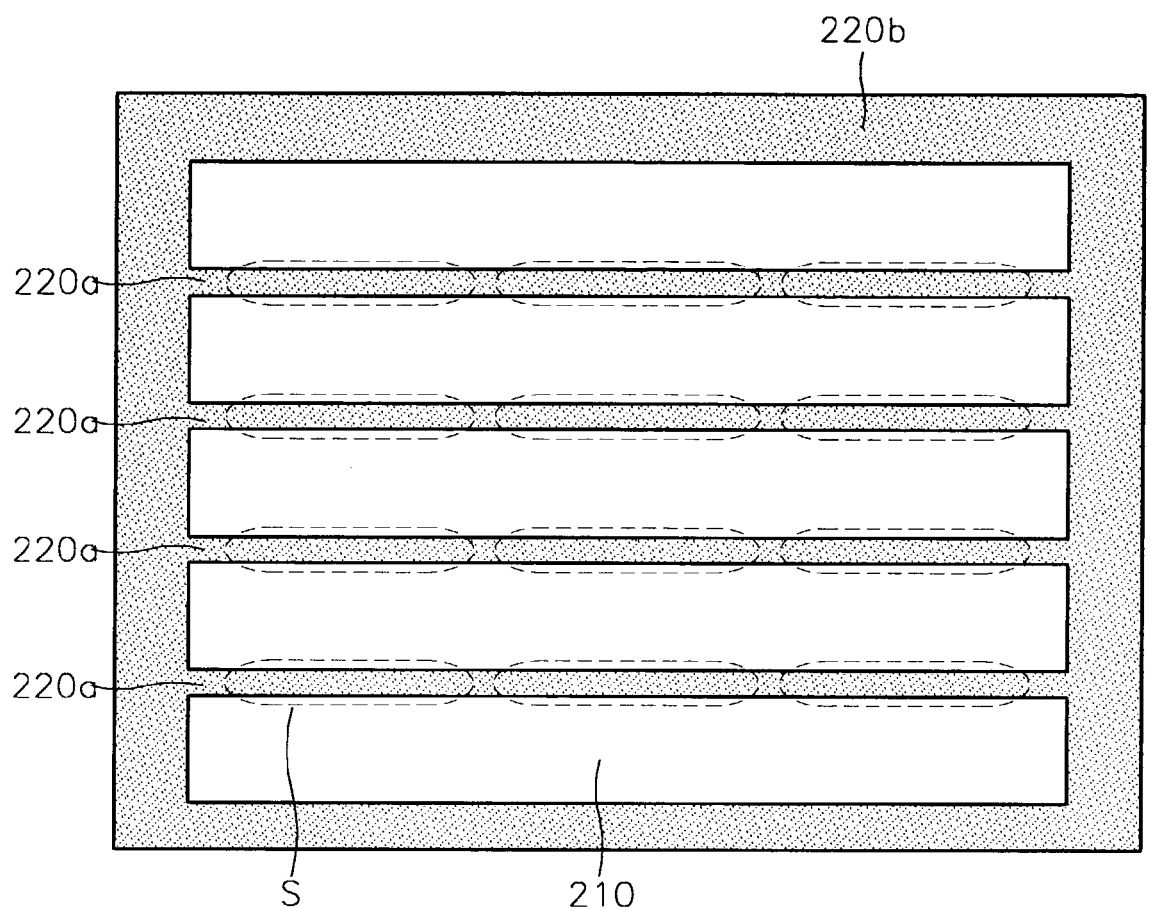

मेथडs OF FORMING INTEGRATED
CIRCUIT DEVICES INCLUDING
CYLINDRICAL CAPACITORS HAVING
SUPPORTERS BETWEEN LOWER
ELECTRODES

RELATED APPLICATION

This application claims the benefit of Korean Patent Application No. 2002-15385, filed Mar. 21, 2002, the disclosure of which is hereby incorporated herein by reference.

FIELD OF THE INVENTION

The present invention relates generally to methods of forming integrated circuit devices and integrated circuit devices formed thereby and, more particularly, to methods of forming integrated circuit devices including cylindrical capacitors and integrated circuit devices formed thereby.

BACKGROUND OF THE INVENTION

To secure a sufficient cell capacitance in a limited area for integrated circuit devices, such as dynamic random access memories (DRAMs), various techniques may be used. Examples of such techniques include using a high dielectric material for a dielectric layer, reducing the thickness of a dielectric layer, and increasing the effective area of lower electrodes. The technique of using the high dielectric material may require the introduction of new equipment, examining the reliability and mass productivity of the dielectric layer, and/or lowering the temperature of succeeding processes, which may require additional material and time. Consequently, because the technique of increasing the effective area of the lower electrodes may allow the existing dielectric layer to be used, and because the technique may be carried out using existing processes, this technique may offer the most promise for application to existing processes.

To increase the effective area of the lower electrodes, a method of forming three-dimensional lower electrodes, such as cylindrical lower electrodes or fin type lower electrodes, a method of growing hemispherical grain (HSG) on the lower electrodes, and/or a method of increasing the height of the lower electrodes may be used. The method of growing the HSG may obstruct the securing of a critical dimension (CD) between the lower electrodes. In addition, the HSG may detach from the lower electrodes and cause bridges between the lower electrodes, which can make it difficult to apply the method of growing the HSG to an integrated circuit device having a design rule of less than 0.14 µm. Accordingly, the methods of forming three-dimensional lower electrodes and increasing the height of the lower electrodes are commonly used to increase the effective area of lower electrodes.

Although the method of forming three-dimensional lower electrodes, such as the cylindrical lower electrodes, is generally resistant to errors because it secures a sufficient charge storage area, it may be difficult to form the cylindrical lower electrodes. In an integrated one-cylinder storage (OCS) structure, to increase the height of the lower electrodes to secure a sufficient capacitance for operating the device, a thick mold oxide may be used. In this case, steep slopes may be generated in etching node holes in which the lower electrodes will be formed so that CDs of the bottom portions of the storage node holes are reduced. Consequently, the thin and tall lower electrodes may have narrow bottoms that result in an unstable profile. Furthermore, weak lower electrodes may fall down and break due to thermal stress, which is generated in succeeding processes, thereby causing bridges between cells. As a result, defects may occur in the devices.

Meanwhile, the method of increasing the height of the lower electrodes may result in a significant step difference between a cell region having capacitors and a peripheral circuit region without the capacitors. Consequently, the method of increasing the height of a lower electrode may involve planarization of an intermetal dielectric (IMD), which is formed on a resultant structure containing the capacitors, to perform a succeeding metal interconnection process.

A typical method for planarizing the IMD involves the following operations: forming and reflowing a boron phosphorus silicate glass (BPSG) layer as an IMD, forming a thick IMD layer, etching portions of the IMD layer on a cell region to reduce a step difference between the cell region and a peripheral circuit region, and planarizing the remaining IMD layer on the cell region by chemical mechanical polishing (CMP). Because the reflow process is performed at a relatively high temperature, the characteristics of transistors in a highly integrated device may deteriorate due to thermal stress and the resistance of a contact region may increase. In addition, the etching and CMP processes may be complicated.

SUMMARY OF THE INVENTION

According to embodiments of the present invention, an integrated circuit device comprises a semiconductor substrate that has a cell region and a peripheral region that surrounds the cell region. A plurality of capacitors that comprise a plurality of lower electrodes, respectively, are disposed in the cell region. Supporters connect adjacent ones of the plurality of lower electrodes to provide structural support and stability to the lower electrodes.

In other embodiments, a mold oxide layer is disposed on the peripheral circuit region and a frame is disposed on the mold oxide layer. A frame supporter connects the frame to one or more of the plurality of lower electrodes.

In still other embodiments, the supporters, the frame supporter, and the frame comprise a material having an etch rate that is different from the etch rate of the mold oxide layer. In particular embodiments, the supporters and the frame supporter comprises silicon nitride.

In further embodiments, the thickness of respective ones of the supporters and the frame supporter is about 10 Å to 1000 Å.

In still further embodiments, the supporters are arranged between ones of the plurality of lower electrodes arranged in a same row or column.

In still further embodiments, the supporters are arranged between ones of the plurality of lower electrodes in adjacent rows or columns.

In other embodiments, the supporters are arranged in rows and columns of the plurality of lower electrodes.

In still other embodiments, the supporters comprise a first layer of supporters connecting adjacent ones of the plurality of lower electrodes and a second layer of supporters connecting adjacent ones of the plurality of lower electrodes.

In further embodiments, the supporters and the plurality of lower electrodes comprise materials that adhere to each other.

In still further embodiments, the supporters comprise silicon nitride and the plurality of lower electrodes comprises doped polysilicon.

In still further embodiments, the supporters protrude inward into the outer walls of the lower electrodes.

In still further embodiments, the supporters connect adjacent ones of the plurality of lower electrodes at points along upper halves of the plurality of lower electrodes where lower halves of the plurality of lower electrodes are adjacent to the semiconductor substrate.

BRIEF DESCRIPTION OF THE DRAWINGS

Other features of the present invention will be more readily understood from the following detailed description of specific embodiments thereof when read in conjunction with the accompanying drawings, in which:

FIGS. 3C through 3E, 4C, and 5C are plan views of of intermediate fabrication products that illustrate methods of forming the DRAM device of FIG. 1 according to some embodiments of the present invention.

DETAILED DESCRIPTION OF PREFERRED EMBODIMENTS

Figure 1:
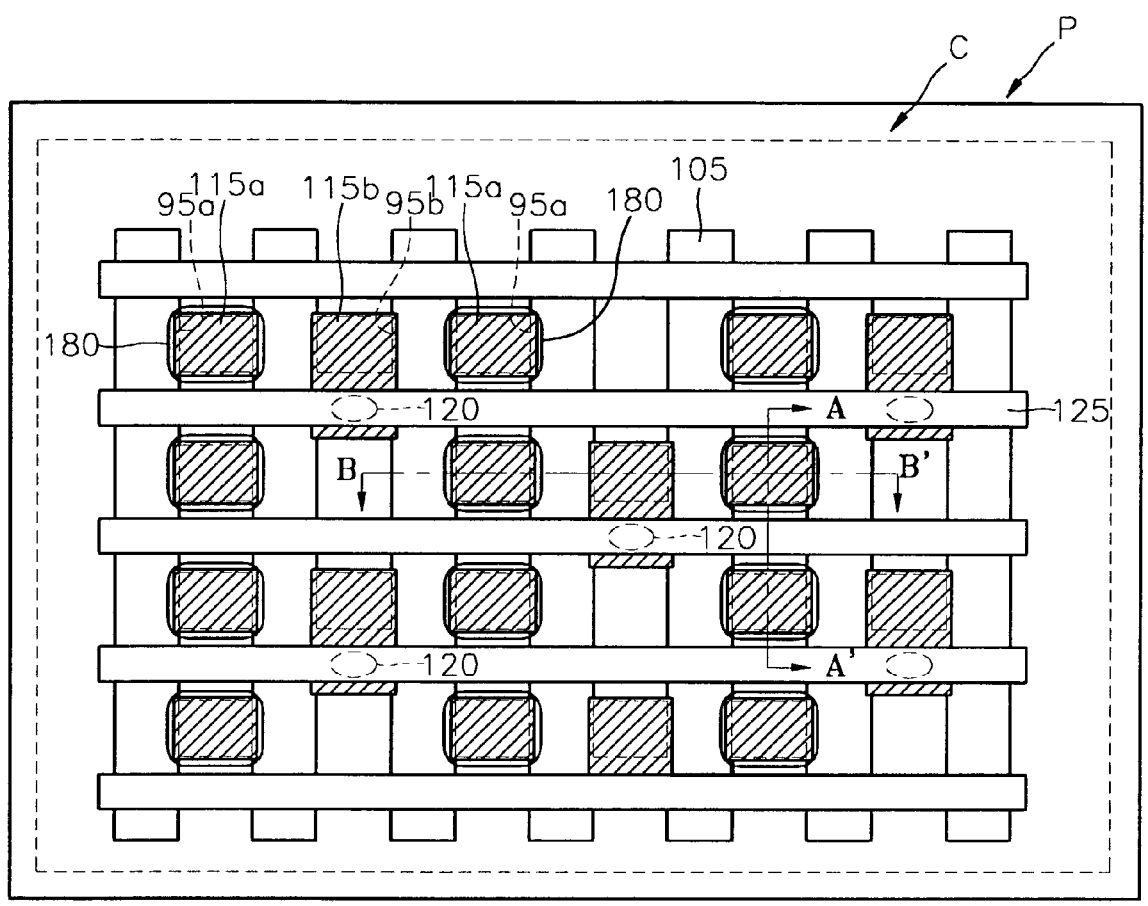
FIG. 1 is a layout diagram that illustrates a dynamic random access memory (DRAM) device comprising a capacitor over bit line (COB) structure according to some embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. It will also be understood that when an element, such as a layer, region, or substrate, is referred to as being "on" another element, it can be directly on the other element or intervening elements may be present. In contrast, when an element, such as a layer, region, or substrate, is referred to as being "directly on" another element, there are no intervening elements present.

FIG. 1 is a layout diagram that illustrates a dynamic random access memory (DRAM) device comprising a capacitor over bit line (COB) structure according to some embodiments of the present invention. The DRAM device comprises sources 95$a$, drains 95$b$, gates 105, cell pads 115$a$ and 115$b$, bit lines 125, and storage node contact plugs 180. Specifically, according to some embodiments of the present invention, cylindrical capacitors are contact with the upper surfaces of the storage node contact plugs 180. A cell region C includes the above elements and a peripheral circuit region P surrounds the cell region C.

An exemplary method of fabricating or forming an integrated circuit device according to some embodiments of the present invention will now be described with reference to the drawings. FIGS. 2A, 3A, 4A, 5A, 6A, 7A, and 8A illustrate the sectional structures of precursors of the integrated circuit device of FIG. 1 cut along a line A–A' in various stages of manufacture or formation. FIGS. 2B, 3B, 4B, 5B, 6B, 7B, and 8B illustrate the sectional structures of precursors of the integrated circuit device of FIG. 1 cut along a line B-B' in various stages of manufacture or formation. FIGS. 3C through 3E, 4C, and 5C illustrate plan views of precursors of the integrated circuit device of FIG. 1 in various stages of manufacture or formation.

Figure 2A:
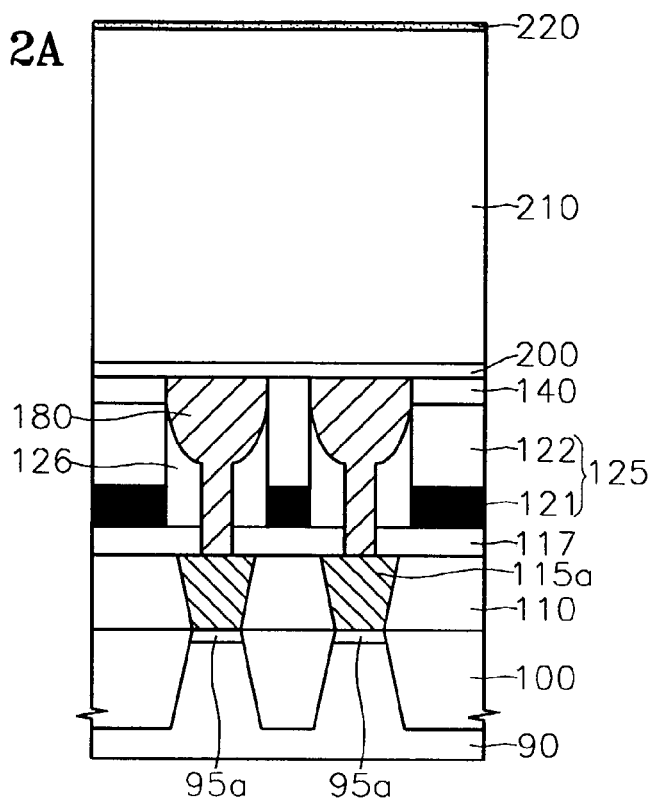
FIGS. 2A, 3A, 4A, 5A, 6A, 7A, and 8A are sectional views of intermediate fabrication products that illustrate methods of forming the DRAM device of FIG. 1 according to some embodiments of the present invention.
Figure 2B:
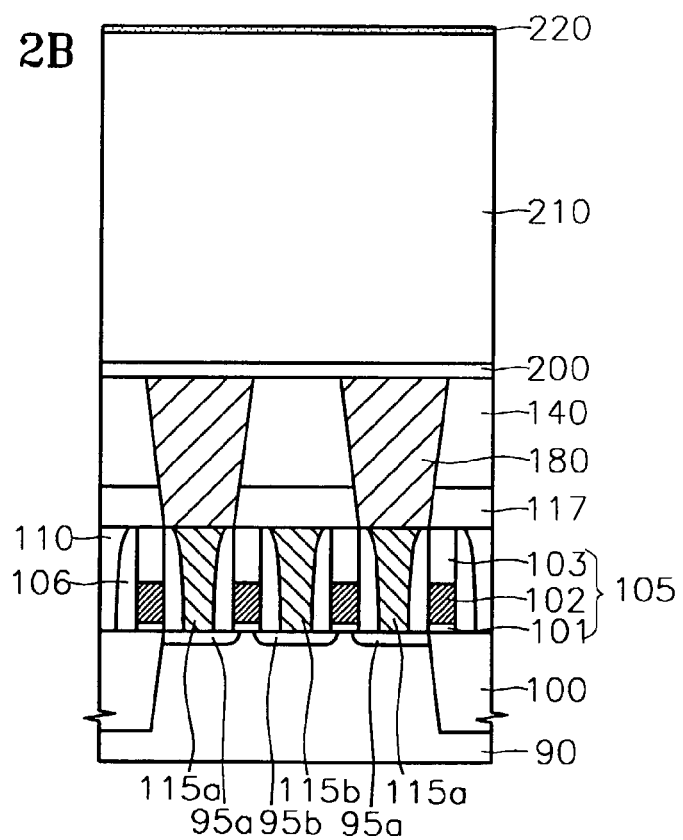
FIGS. 2B, 3B, 4B, 5B, 6B, 7B, and 8B are sectional views of of intermediate fabrication products that illustrate methods of forming the DRAM device of FIG. 1 according to some embodiments of the present invention.

Referring to FIGS. 2A and 2B, a shallow trench isolation region 100 is formed in a semiconductor substrate 90 to define an active region and an inactive region. Gates 105, which are formed by successively stacking a gate oxide layer 101, a gate conductive layer 102, and a mask nitride layer 103, are formed on the active region. After depositing silicon nitride on the entire surface of the semiconductor substrate 90, the silicon nitride is anisotropically etched to form dielectric spacers 106 on both sidewalls of the gates 105. Impurities are then implanted into the entire surface of the semiconductor substrate 90 to form a plurality of sources 95$a$ and drains 95$b$.

A first insulating layer 110 is formed on the entire surface of the semiconductor substrate 90 and then the upper surface of the first insulating layer 110 is planarized using chemical mechanical polishing (CMP). The first insulating layer 110 is then etched on both sidewalls of the gates 105 using a cell pad mask until the sources 95$a$ and drains 95$b$ are exposed to form contact holes for forming cell pads. After removing the cell pad mask, the contact holes are filled with a conductive material. The conductive material is planarized using CMP to make the upper surface of the conductive material approximately level with the first insulating layer 110. Thus, cell pads 115$a$ and 115$b$, which are electrically connected to the sources 95$a$ and drains 95$b$ respectively, are formed.

A second insulating layer 117 is formed on the entire surface of the semiconductor substrate 90 and then the second insulating layer 117 is etched to form bit line contact holes that expose the cell pads 115$b$. The bit line contact holes are filled with a conductive material to form bit line contact plugs 120 (see FIG. 1), and the bit lines 125 are formed to pass over the bit line contact plugs 120 while crossing over the gates 105.

In particular, the bit lines 125 are formed by successively stacking bit line conductive layers 121 and cap layers 122. After depositing a silicon nitride material on the entire surface of the semiconductor substrate 90, the silicon nitride material is anisotropically etched to form bit line spacers 126 on the sidewalls of the bit lines 125. A third insulating layer 140 is formed of the resultant structure having the bit line spacers 126, and the third insulating layer 140 is etched to form storage node contact holes for exposing the cell pads 115$a$. The storage node contact holes are filled with a conductive material and the upper surface of the conductive material is planarized to form storage node contact plugs 180.

An etch stopper 200 is formed on the entire surface of the third insulating layer 140 having the storage node contact plugs 180. In some embodiments, the etch stopper 200 is formed by depositing silicon nitride material. A first mold oxide layer 210, which is formed on the etch stopper 200, may be a borophosphosilicate glass (BPSG) layer or a tetra ethyl ortho silicate (TEOS) layer, which may be formed by plasma enhanced-chemical vapor deposition (PE-CVD). Then, a support layer 220 is formed on the entire surface of the first mold oxide layer 210. It is preferable that the support layer 220 has an etch rate different from those of the first mold oxide layer 210 and a succeeding mold oxide layer when etched by a predetermined etch solution. For example, in some embodiments, the support layer 220 may be formed by depositing the silicon nitride material to a thickness of about 10 to 1000 Å.

Figure 3A:
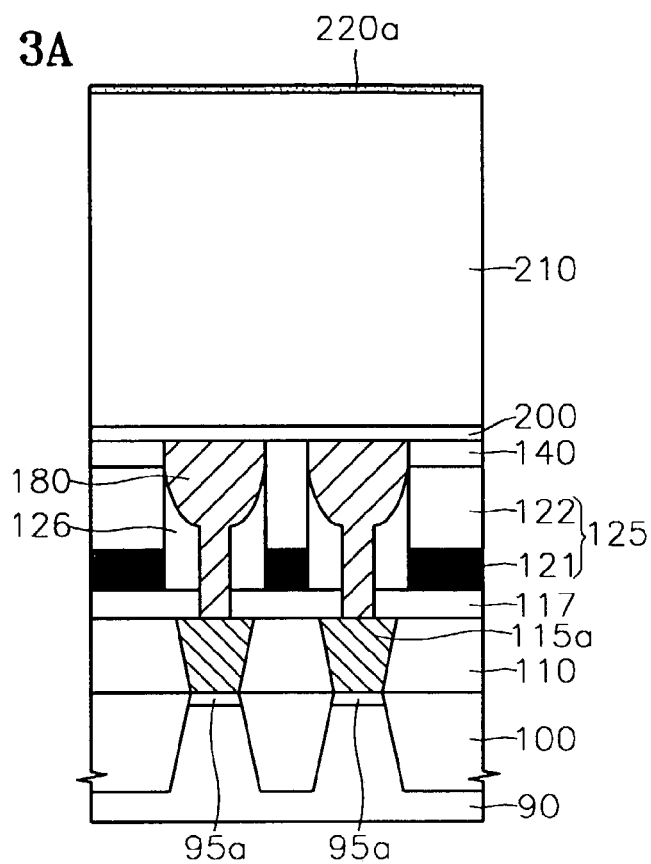
Figure 3B:
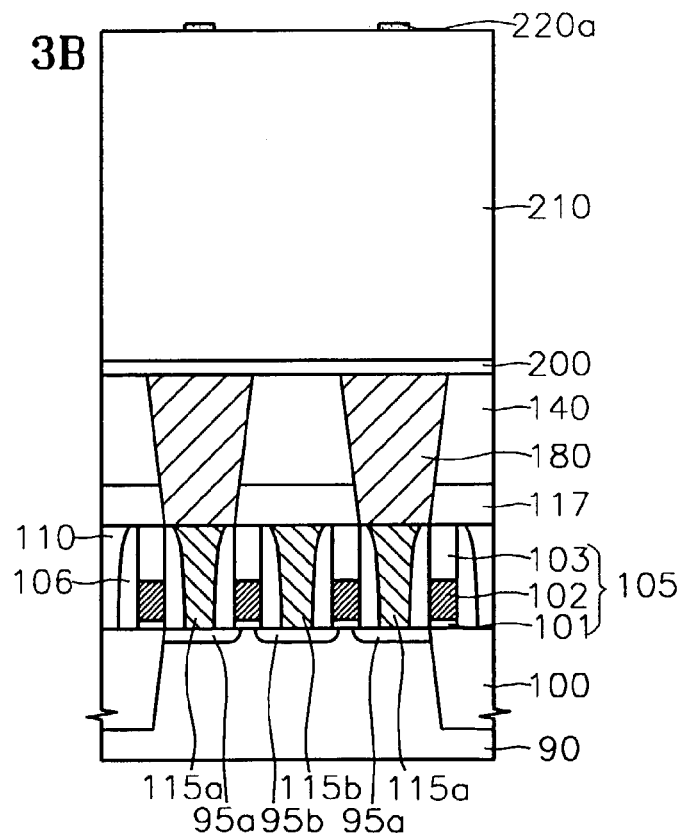
Figure 3C:
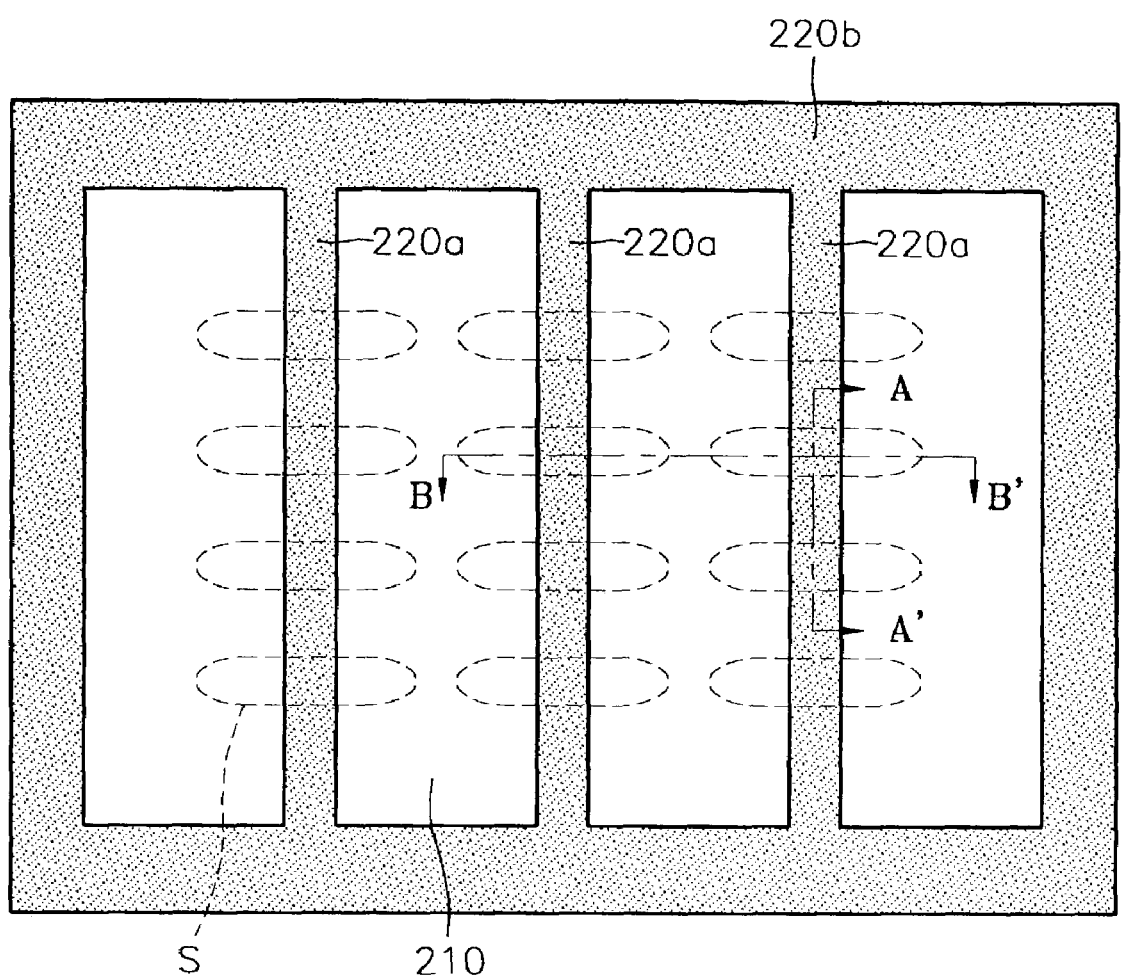

Referring to FIGS. 3A, 3B, and 3C, the support layer 220 is patterned by a dry etch process to form line type patterns 220a that elongate in the lengthwise direction of a gate 105 and a frame 220b, which is integrally connected to each end of the line type patterns 220a for forming supporters. The support layer 220 is patterned to eliminate portions of the support layer 220 through which the upper surface of the first mold oxide layer 210 is exposed. FIGS. 3A and 3B correspond to sectional views formed by cutting FIG. 3C along lines A–A' and B–B', respectively.

Figure 3D:
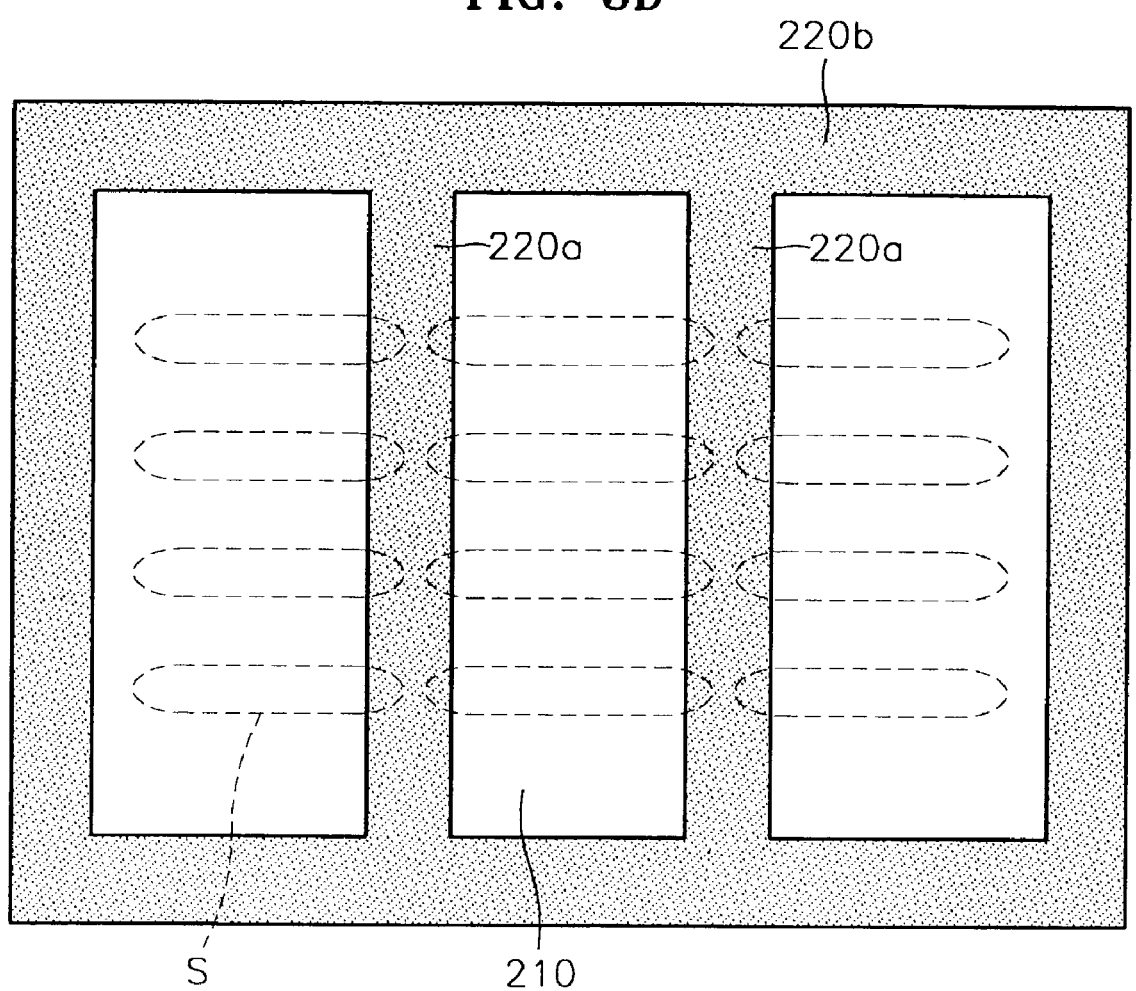

Referring to FIG. 3C, portions S, which are illustrated by ellipses with dotted lines, represent the storage node holes where capacitors are to be subsequently formed. Because the capacitors will be formed to be in contact with the upper surfaces of the storage node contact plugs 180 in FIG. 1, the portions S representing the storage node holes are defined after designing a layout as shown in FIG. 1. Consequently, the locations of the line type patterns 220a for forming supporters are determined based on the locations of the storage node holes. In some embodiments of the present invention, the line type patterns 220a for forming supporters are formed such that the storage node holes cross over line type patterns 220a as shown in FIG. 3C. In other embodiments, line type patterns 220a for forming supporters are placed between adjacent storage node holes as shown in FIG. 3D. In still other embodiments, line type patterns 220a for forming supporters are elongated in the lengthwise direction of a bit line 125, but not in the lengthwise direction of a gate 105 as shown in FIG. 3E.

Operations for forming the line type patterns 220a for forming supporters and the frame 220b, which is integrally connected to the ends of the line type patterns 220a, can be performed more than once. To achieve this, the operations for forming the mold oxide layer 210, forming the support layer 220, and patterning the support layer 220 are repeated. As a result, more than one layer of supporters may be formed to support the lower electrodes at the sides of the lower electrodes. As the number of supporters increases, the lower electrodes may be more firmly supported to prevent them from falling down. Therefore, the number of supporters may be determined based on a tradeoff between an increase in the number of operations and a reduction in the effective area of the lower electrodes.

Figure 4A:
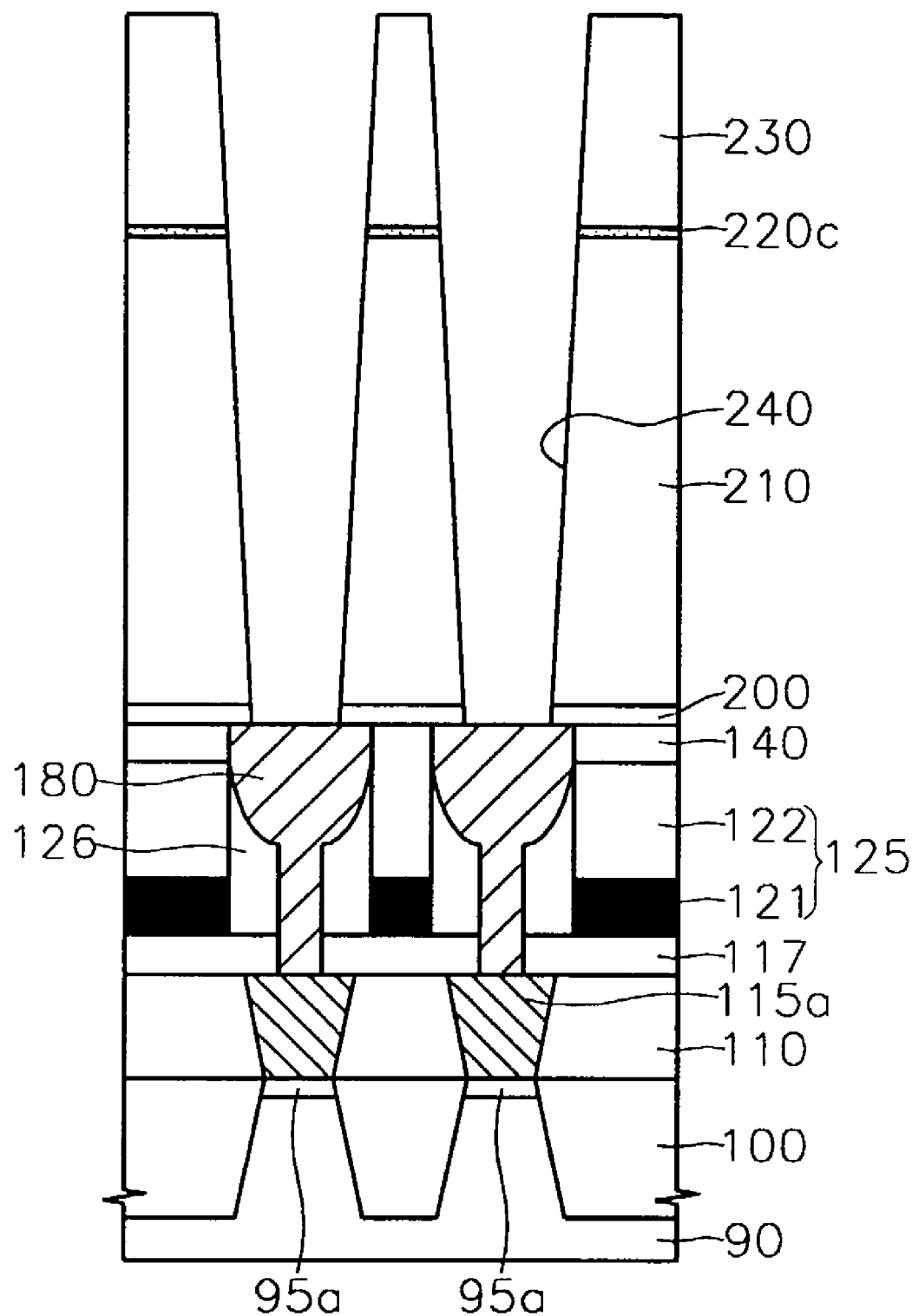
Figure 4B:
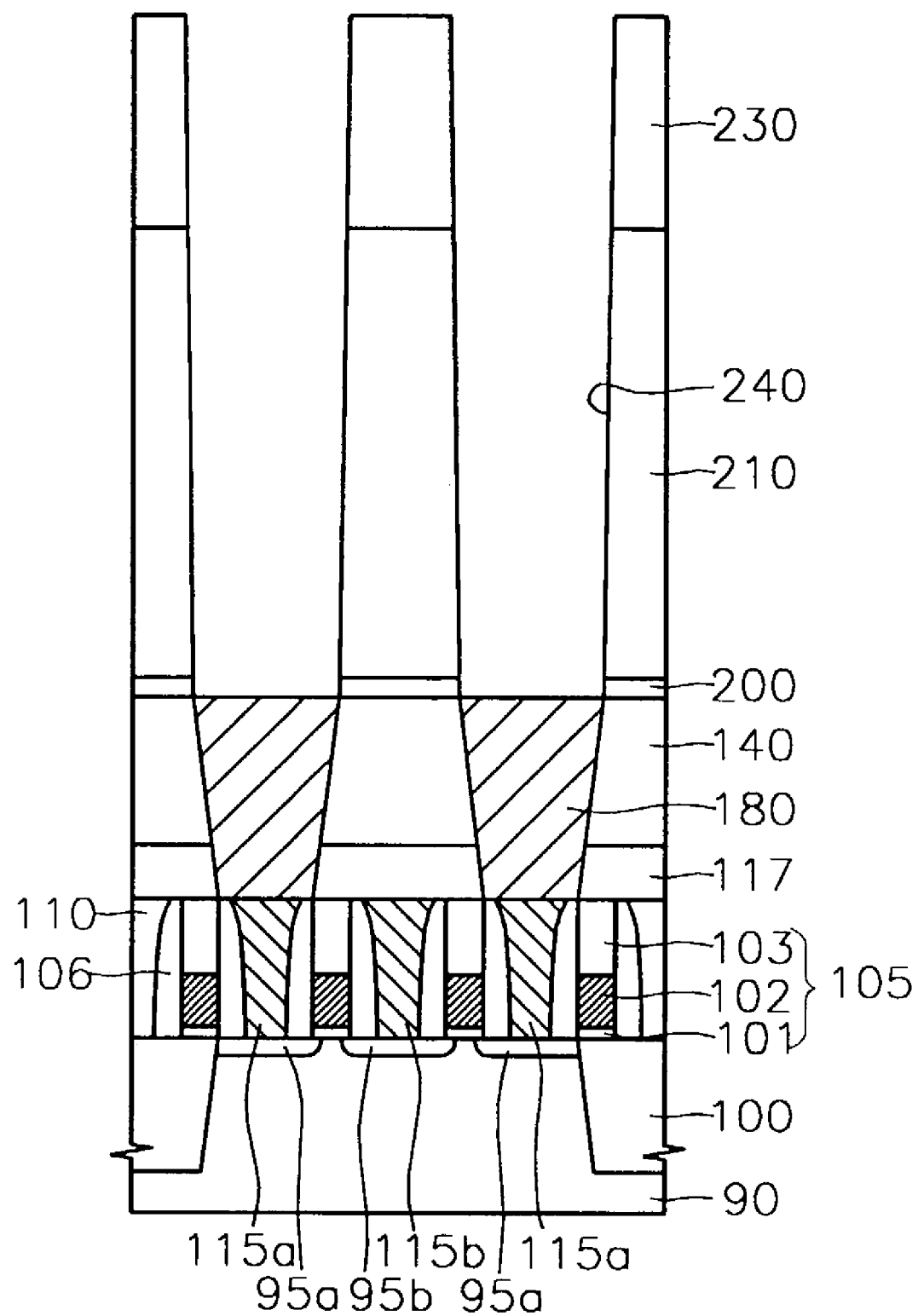
Figure 4C:
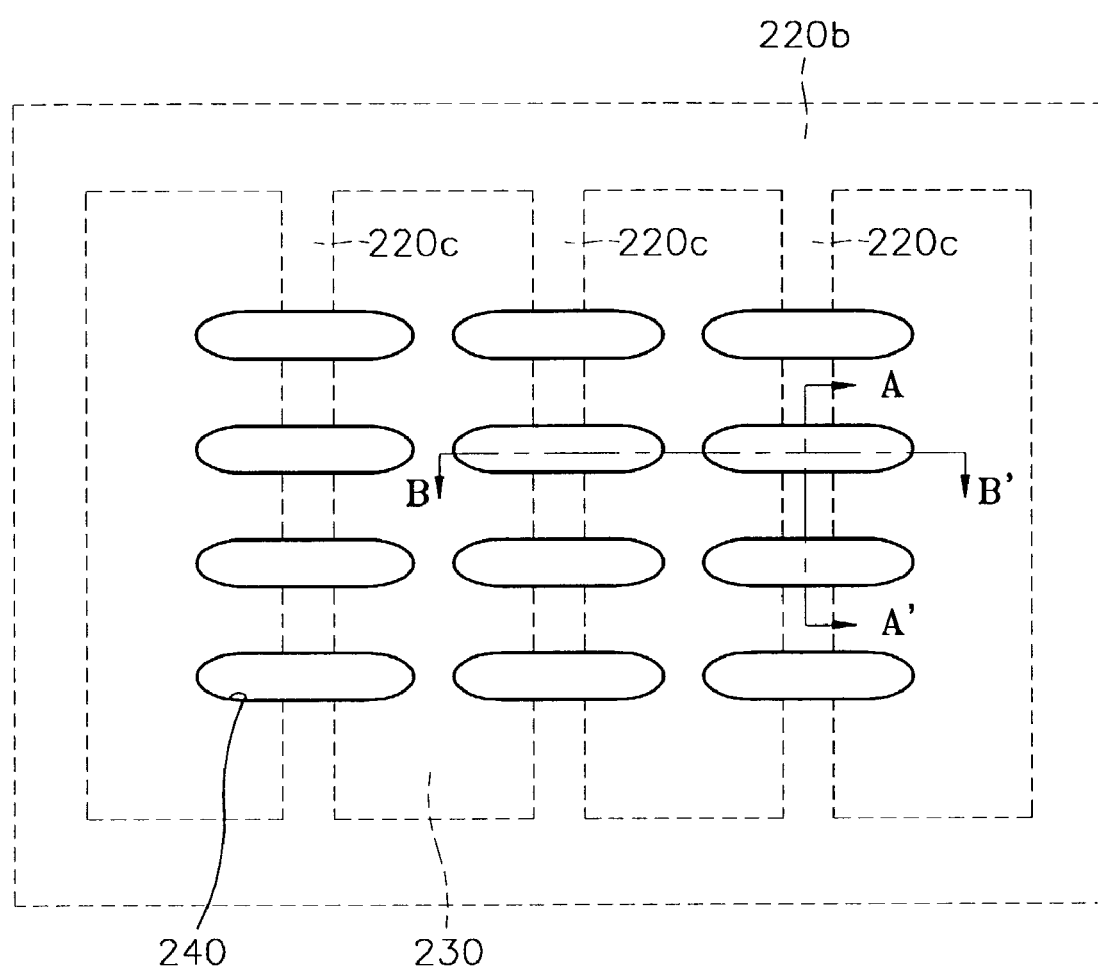

Referring to FIGS. 4A, 4B, and 4C, a second mold oxide layer 230 is formed on the line type patterns 220a for forming supporters, the frame 220b, and the first mold oxide layer 210. The second mold oxide layer 230 may be formed in the same maimer as the first mold oxide layer 210. In other embodiments, the second mold oxide layer 230 may be formed using a different method from that used to form the first mold oxide layer 210 as long as the second mold oxide layer 230 comprises a material having an etch rate different from that of the support layer 220 when etched by a predetermined etch solution.

Portions of the second mold oxide layer 230, the line type patterns 220a for forming supporters, and the first mold oxide layer 210 corresponding to the regions S for the storage node holes 240 are etched to form a plurality of storage node holes 240. In this case, a dry etch process without etching selectivity is performed to evenly etch the first and second mold oxide layers 210 and 230 and the line type patterns 220a for forming supporters. In addition, the etch stopper 200 is also etched to expose the upper surfaces of the storage node contact plugs 180. In particular, with reference to FIG. 4C, the storage node holes 240 are formed while etching the line type patterns 220a for forming supporters to form supporters 220c between the storage node holes 240. FIGS. 4A and 4B correspond to sectional views formed by cutting FIG. 4C along lines A–A' and B–B', respectively.

Figure 5A:
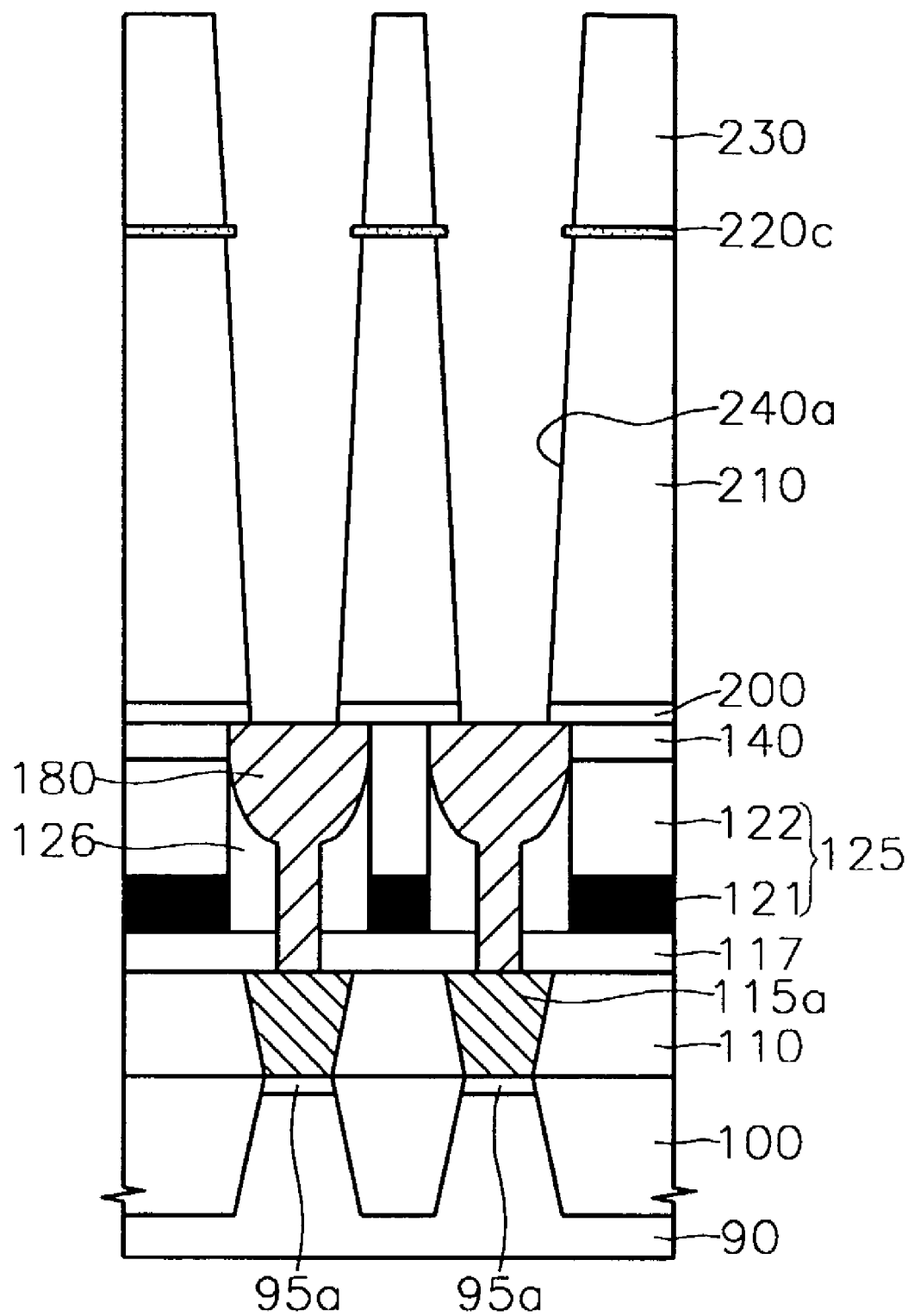
Figure 5B:
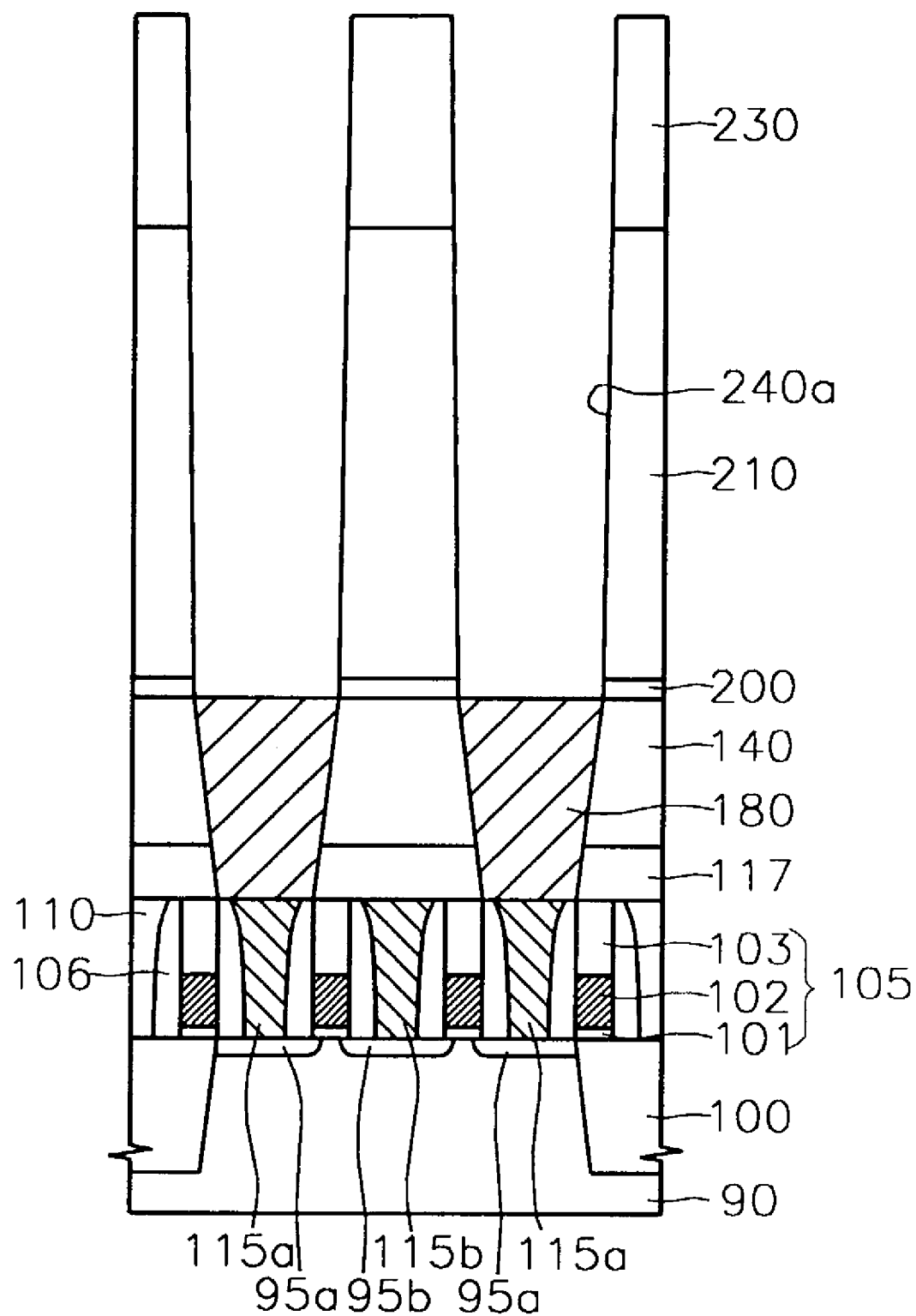
Figure 5C:
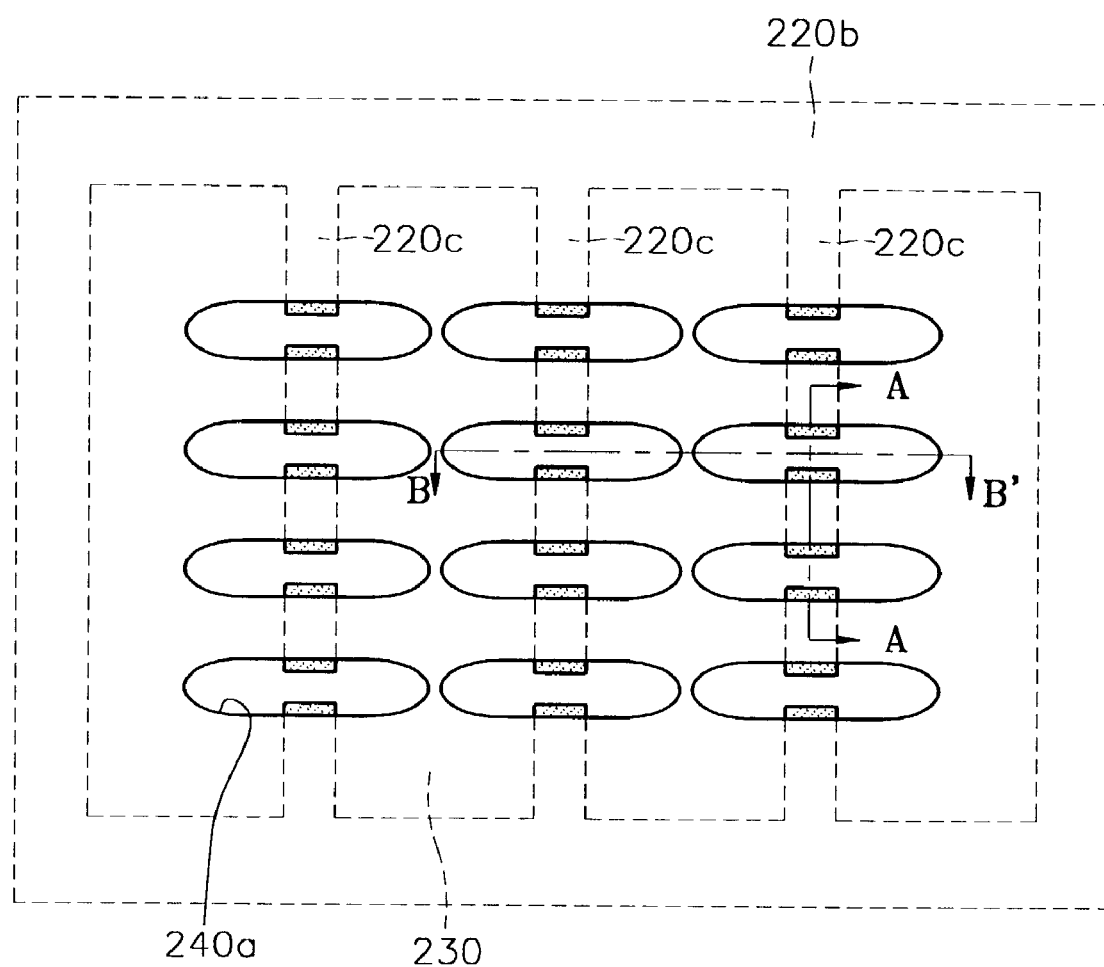

Referring to FIGS. 5A, 5B, and 5C, the inner walls of the storage node holes 240 may be wet etched. Accordingly, the storage node holes 240 become storage node holes 240a with enlarged widths. Consequently, the ends of the supporters 220c formed between the storage node holes 240a may be exposed inward from the inner walls of the storage node holes 240a. The wet etch process is optional.

Figure 6A:
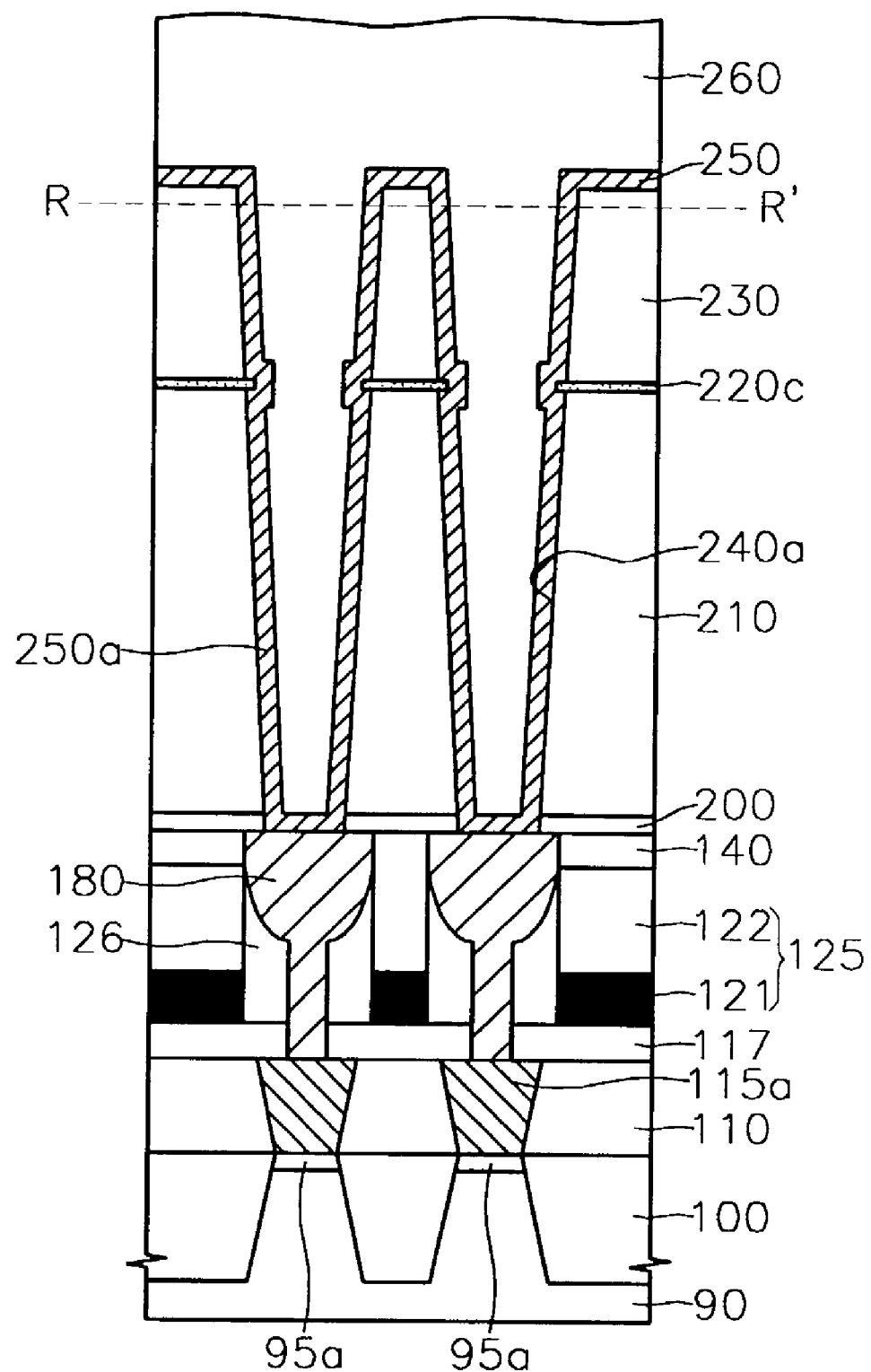
Figure 6B:
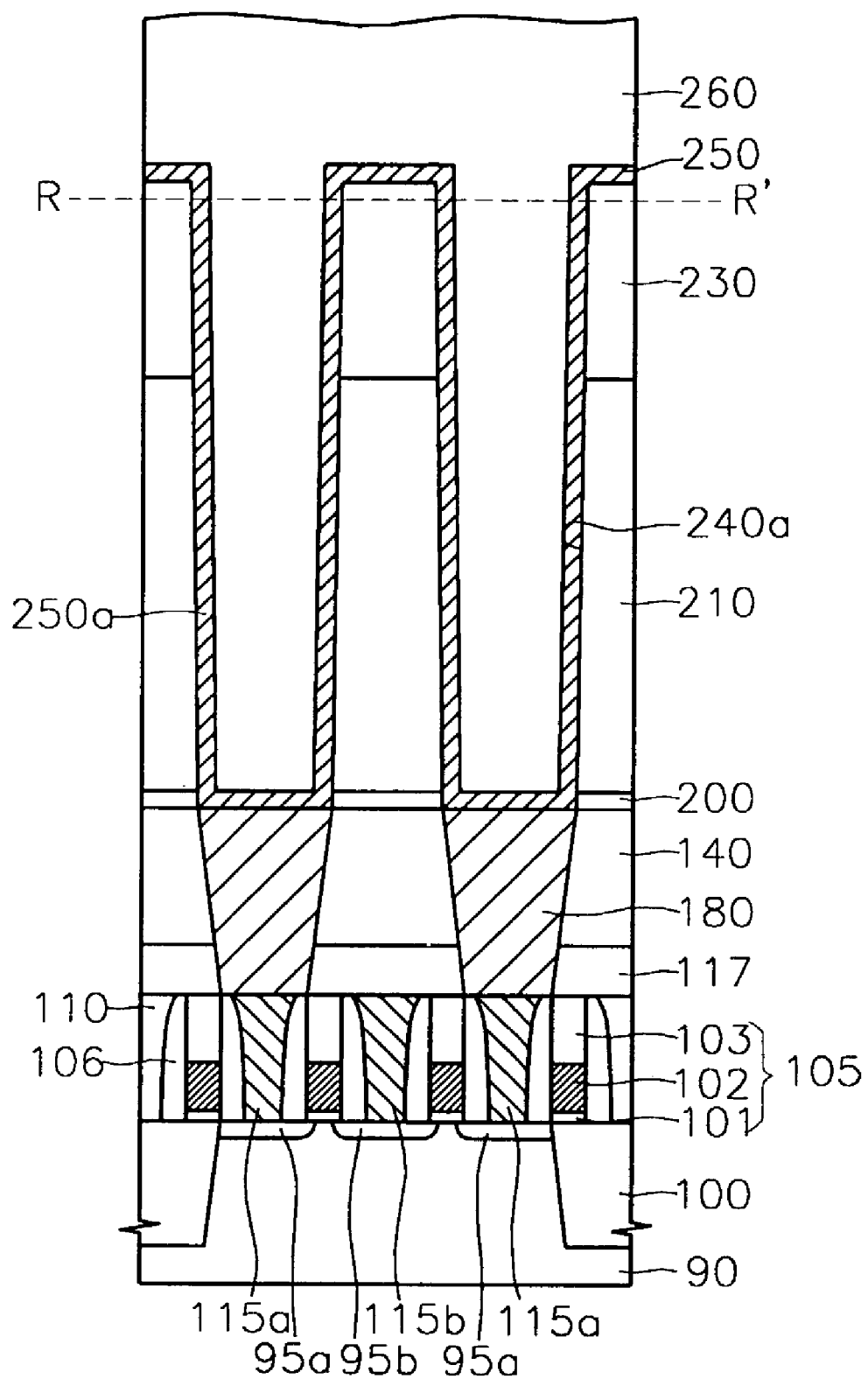

Referring to FIGS. 6A and 6B, a conductive layer 250 for forming lower electrodes, such as a doped polysilicon layer is formed on the resultant structure comprising the storage node holes 240a. In some embodiments, the supporters 220c and the conductive layer 250 comprise materials having generally good mutual adhesion properties. In some embodiments, the supporters 220c comprise a silicon nitride layer and the conductive layer 250 comprises a doped polysilicon layer so that they adhere to each other relatively well. It will be understood, however, that various materials can be used for the supporters 220c and the conductive layer 250. For example, in a case where platinum (Pt), ruthenium (Ru), or an oxide thereof is used for the conductive layer 250 for forming lower electrodes comprising metal or metal oxide lower electrodes, metal-insulator-metal (MIM) capacitors or metal-insulator-semiconductor (MIS) capacitors can be formed by using a material having excellent adhesion property to Pt, Ru, or an oxide thereof to form the supporters.

The storage node holes 240a are filled with an oxide layer 260, such as a spin on glass (SOG) layer, a BPSG layer, an undoped silicate glass (USG) layer, or a plasma-enhanced tetra ethyl ortho silicate (PE-TEOS) layer having an excellent filling characteristic. Because the conductive layer 250 is formed on the ends of the supporters 220c, which protrude inward from the walls of the storage node holes 240a, the contact area between the conductive layer 250 and the supporters 220c increases, which improves adhesion between the conductive layer 250 and the supporters 220c. Upper portions of the oxide layer 260 and the conductive layer 250 on the second mold oxide layer 230 are eliminated by CMP process or an etch back process to expose the upper surface of the second mold oxide layer 230. Accordingly, the portion above a line R–R' in FIGS. 6A and 6B is removed. As a result, separate lower electrodes 250a are formed in each cell.

Figure 7A:
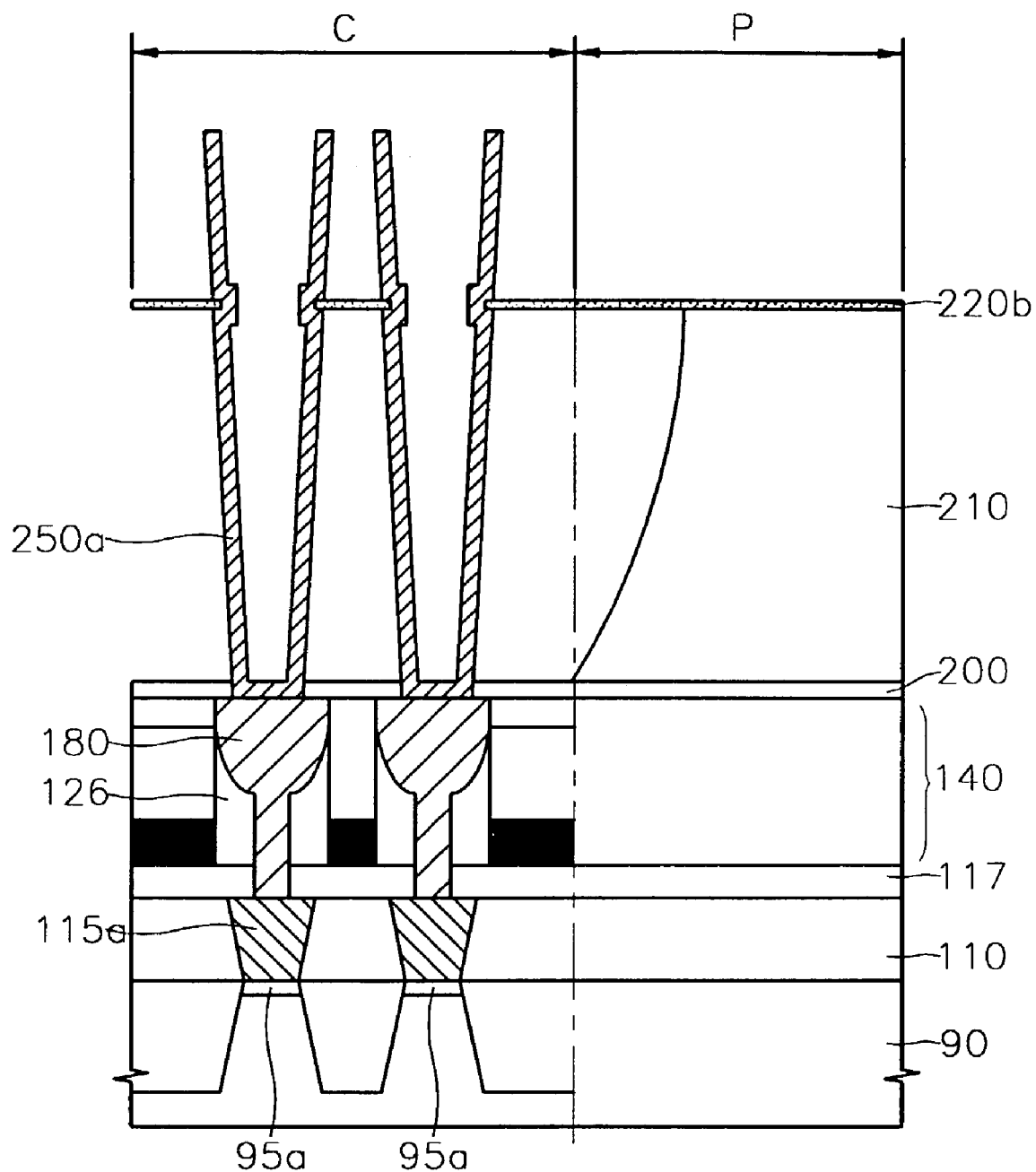
Figure 7B:
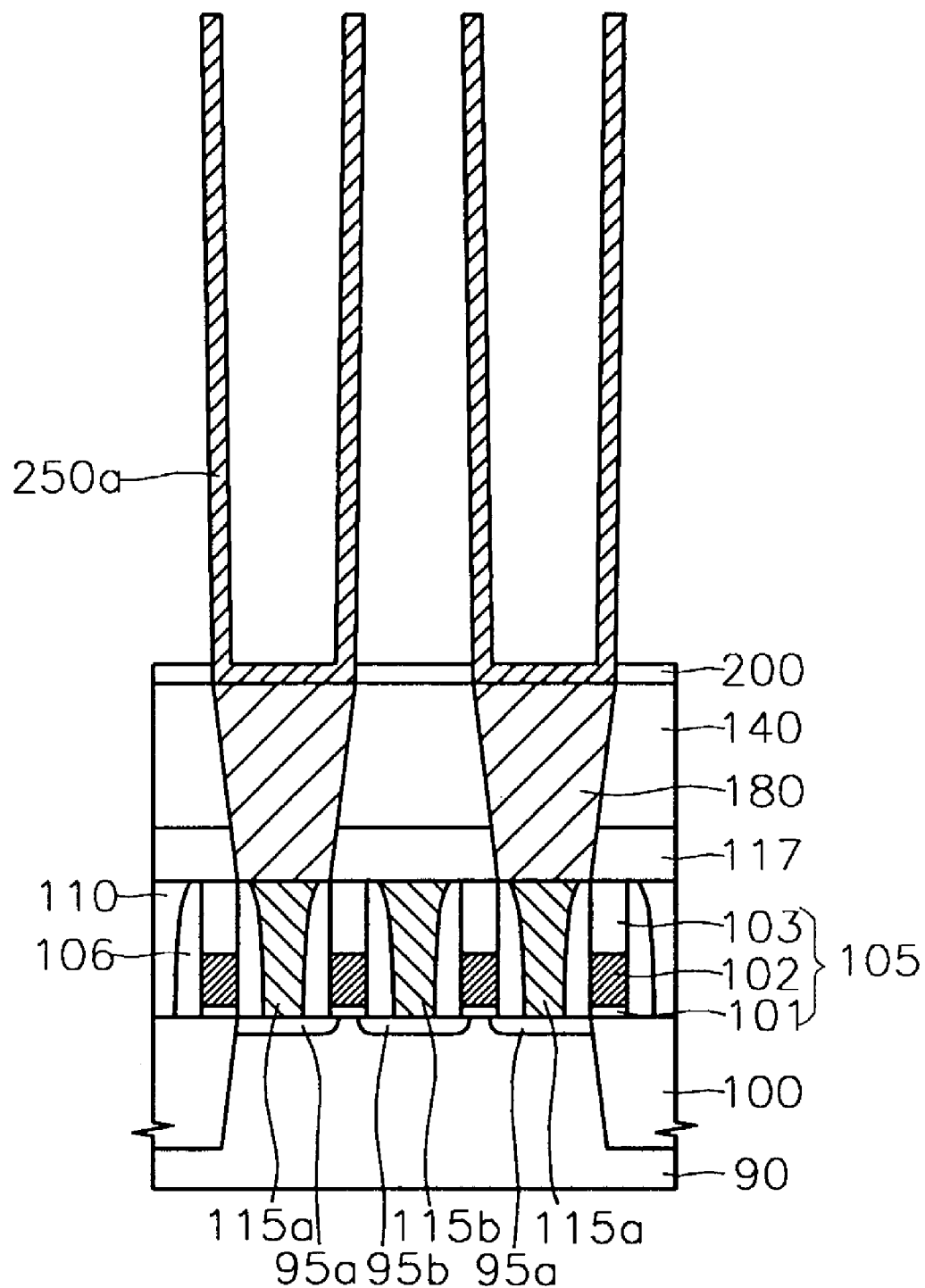

Referring to FIGS. 7A and 7B, the oxide layer 260 remaining in the lower electrodes 250a and the second and first mold oxide layers 230 and 210 are removed by the wet etching process. In this case, the supporters 220c are not etched because an etch solution having a greater etch rate on the first and second mold oxide layers 210 and 230 than on the support layer 220 is used. FIG. 7A illustrates the peripheral circuit region P as well as the cell region C. As shown in FIG. 7A, while the oxide layer 260 and the second and first mold oxide layers 230 and 210 are removed from the cell region C, only a portion of the first mold oxide layer 210 is removed at the boundary of the cell region C in the peripheral circuit region P. Consequently, a larger portion of the first mold oxide layer 210 remains under the frame 220b because the frame 220b operates as an etch stopper and protects the first mold oxide layer 210.

Figure 8A:
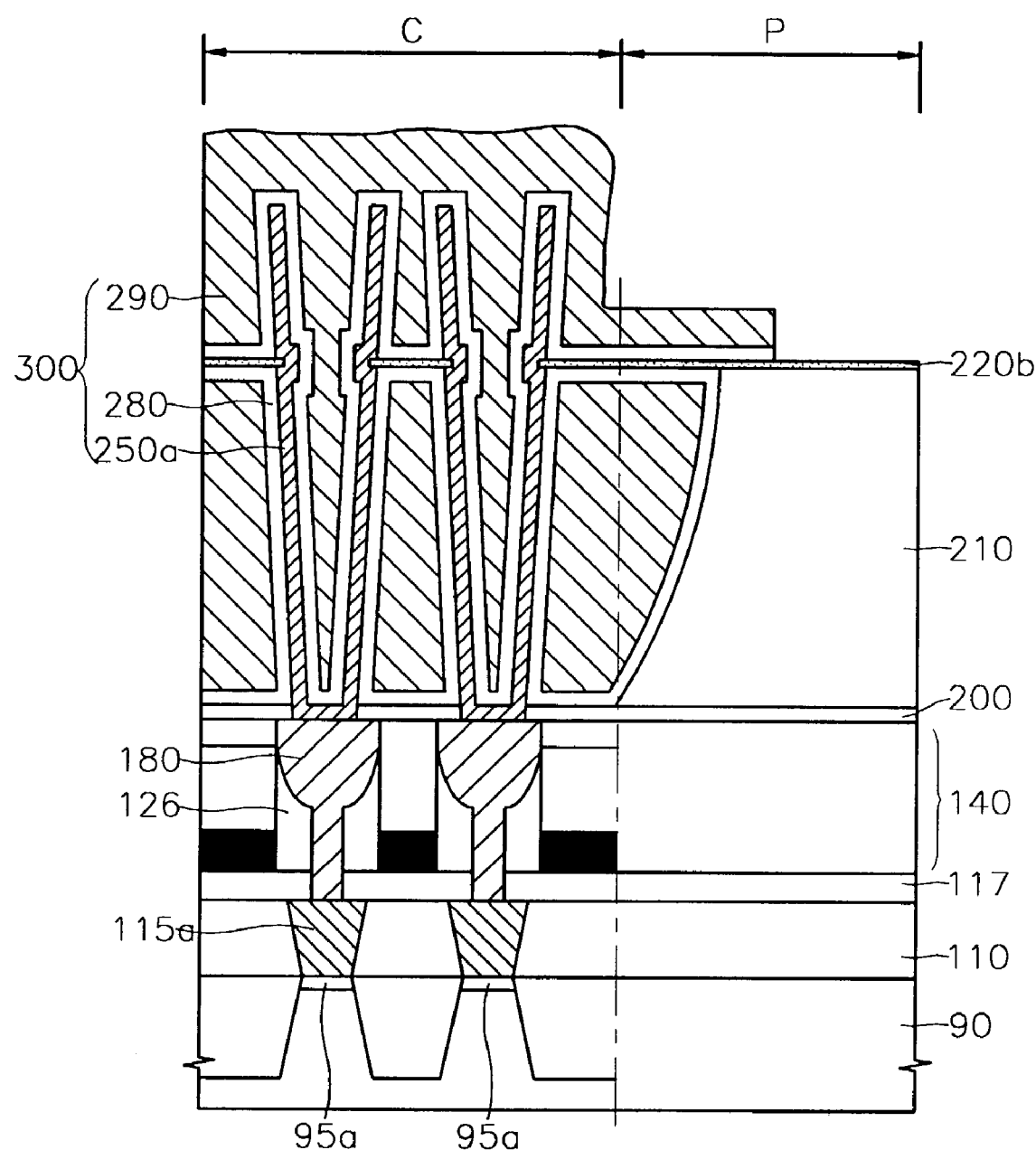
Figure 8B:
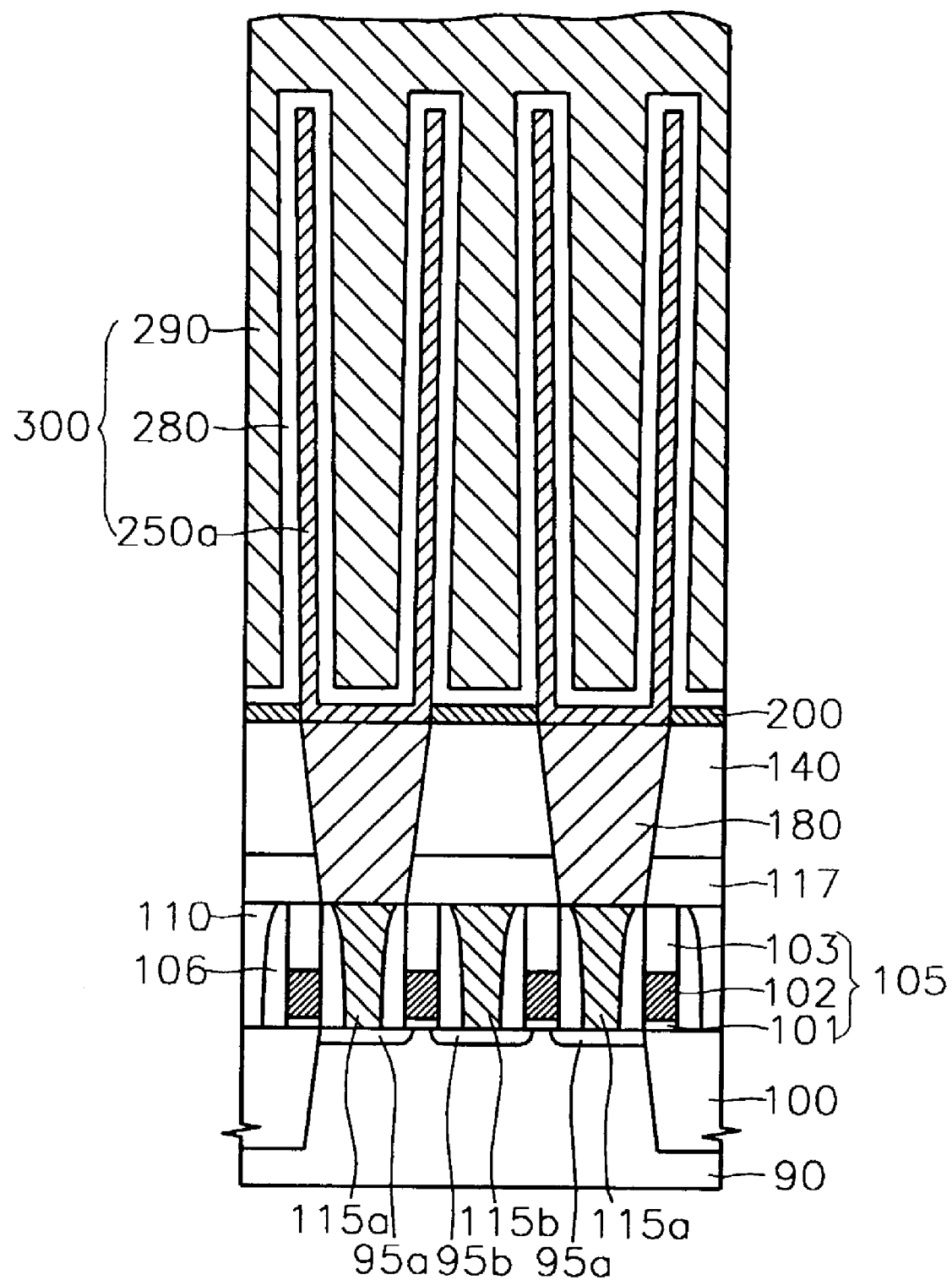

Referring to FIGS. 8A and 8B, capacitors 300 are manufactured or formed by successively forming a dielectric layer 280 and an upper electrode 290 on the lower electrodes 250a. FIG. 8A illustrates the peripheral circuit region P as well as the cell region C. As shown in FIG. 8A, a step difference between the cell region C and the peripheral circuit region P is determined by subtracting the thickness of the first mold oxide layer 210 under the frame 220b from the height of the capacitors 300. Accordingly, in contrast to a conventional method of entirely removing a mold oxide layer, embodiments of the present invention compensate for the step difference by the thickness of the first mold oxide layer 210.

As shown in FIGS. 1 and 8A, an integrated circuit device according to some embodiments of the present invention comprises a semiconductor substrate 90 having a cell region C and a peripheral circuit region P that surrounds the cell region C. A plurality of capacitors 300, comprising cylindrical lower electrodes 250a, a dielectric layer 280, and upper electrodes 290, are connected to the conductive region of the semiconductor substrate 90, namely, the storage node contact plugs 180. In this case, the capacitors 300 are arranged in the rows and columns of the cell region C in the semiconductor substrate 90. The frame 220b, which is integrally connected to the outermost supporters 220c while covering the peripheral circuit region P, protects the first mold oxide layer 210 under the frame 220b.

In the case where the line type patterns 220a for forming supporters are formed as shown in FIG. 3C or 3E, the supporters 220c are located between the lower electrodes 250a that are arranged on the same rows or the same columns. In the case where the line type patterns 220a for forming supporters are formed as shown in FIG. 3D, the supporters 220c are located between the lower electrodes 250a that are arranged on two adjacent rows or columns.

As the height of the supporters 220c position relative to the lower electrodes 250a increases, the supporters 220c may provide firm support of the lower electrodes 250a at sides thereof. A preferred height for positioning the supporters 220c, e.g., higher than half the height of the lower electrodes 250a, has to be determined because if the height of the supporters 220c is excessively high, then the supporters 220c may be removed in the planarization process. In the case where more than two layers of the supporters 220c are formed in a vertical direction of the lower electrodes 250a, the uppermost supporters may be located higher than half the height of the lower electrodes 250a.

Figure 9:
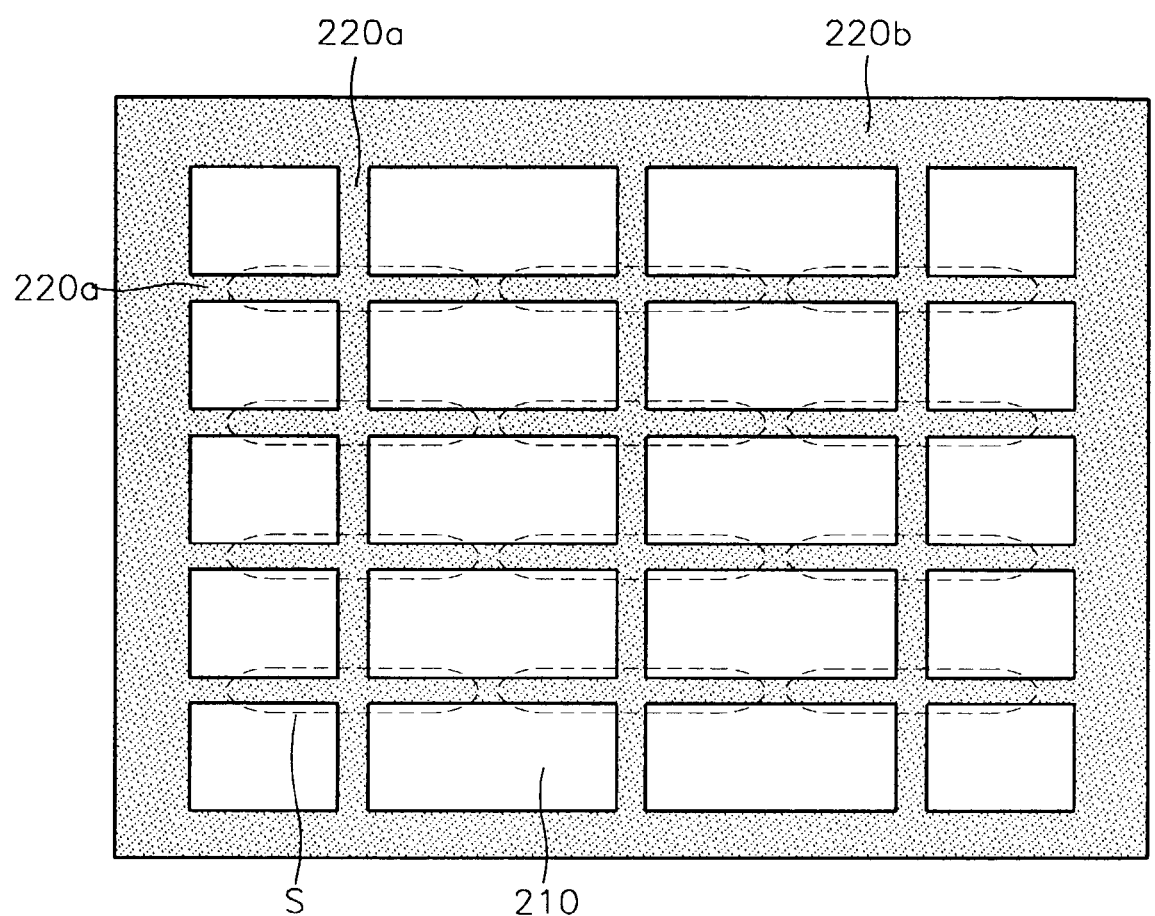
FIG. 9 is a plan view of a DRAM device that illustrates methods of forming the DRAM device according to some embodiments of the present invention.

FIG. 9 is a plan view of a DRAM device that illustrates methods of forming the DRAM device according to some embodiments of the present invention. After finishing forming a support layer 220 as shown in FIGS. 2A and 2B, the support layer 220 is patterned to form line type patterns 220a for forming supporters and a frame 220b. In this case, the line type patterns 220a for forming supporters are elongated in the lengthwise direction of a gate 105 and the lengthwise direction of a bit line 125 and cross over each other. The frame 220b is integrally connected to the ends of the line type patterns 220a for forming supporters. Portions S in which storage node holes are formed are located at portions where the line type patterns 220a cross. As a result, the mechanical strength of the supporters to support the lower electrodes may increase relative to embodiments in which the supporters are arranged along rows or columns of the frame 220b.

In the above-described invention, because the supporters support the lower electrodes at the sides of the lower electrodes, the lower electrodes are less likely to fall down even when the height of the lower electrodes increases. Thus, generation of bridges between adjacent capacitors may be avoided. Moreover, the lower electrodes are less likely to be displaced or to fall down in succeeding cleaning processes. In addition, the lower electrodes remain mechanically strong so as not to damage themselves and the capacitors, thereby allowing a relatively high cell capacitance to be obtained. Advantageously, electrical failures in the semiconductor device may be reduced while improving yield of the semiconductor device.

The frame, which is formed in the peripheral circuit region while being integrally connected to the supporters prevents the underlying mold oxide layer from being etched. Therefore, the step difference between the cell region and the peripheral circuit region on the semiconductor device is determined by subtracting the thickness of the mold oxide layer under the frame from the height of the capacitors. Consequently, the method according to the present invention reduces the step difference between the cell region and the peripheral circuit region compared to the conventional method in which the mold oxide layer is removed substantially in its entirety.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A method of forming an integrated circuit device, comprising:
    forming a cell region and a peripheral circuit region that surrounds the cell region in a semiconductor substrate;
    forming a plurality of capacitors that comprise a plurality of lower electrodes, respectively in the cell region;
    forming supporters that connect adjacent ones of the plurality of lower electrodes;
    forming a mold oxide layer on the peripheral circuit region;
    forming a frame on the mold oxide layer; and
    forming a frame supporter that connects the frame to one of the plurality of lower electrodes.

2. The method of claim 1, wherein forming the plurality of capacitors comprises:
    forming a first mold oxide layer on the surface of the semiconductor substrate;
    forming a supporter layer on the surface of the first mold oxide layer;
    forming line type patterns by patterning the supporter layer to elongate the line type patterns in one of rows and columns, the frame being integrally connected to each end of the line type patterns for forming supporters;
    forming a second mold oxide layer on the line type patterns, the frame, and the first mold oxide layer;
    etching the second mold oxide layer, the line type patterns, and the first mold oxide layer to expose a conductive region formed on the semiconductor substrate, thereby forming a plurality of storage node holes arranged in rows and columns and forming the supporters between the storage node holes by etching the line type patterns;

forming lower electrodes on the inner walls of the storage node holes so that the lower electrodes connect to the supporters;

removing the second mold oxide layer; and removing the first mold oxide layer from regions outside of the frame.

3. The method of claim 2, wherein the plurality of storage node holes cross over the line type patterns.

4. The method of claim 2, wherein the plurality of storage node holes is formed such that respective ones of the line type patterns are formed between adjacent storage node holes.

5. The method of claim 2, wherein the supporter layer comprises a material having an etch rate that is different from the etch rates of the first and second mold oxide layers.

6. The method of claim 2, wherein the following is performed after etching the second mold oxide layer:

widening respective ones of the plurality of storage node holes;

wet cleaning inner walls of the storage node holes to expose ends of the respective supporters arranged between respective ones of the plurality of storage node holes.

7. The method of claim 2, further comprising:

forming a conductive layer for forming the plurality of lower electrodes on the resultant structure having the storage node holes;

forming an oxide layer on the resultant structure having the conductive layer so as to fill the storage node holes;

planarizing and removing the oxide layer and the conductive layer on the second mold oxide layer until the upper surface of the second mold oxide layer is exposed; and removing the oxide layer and the second and first mold oxide layers by wet etching.

8. The method of claim 2, wherein forming the first mold oxide layer, forming the supporter layer, and forming the line type patterns are repeated to form multiple supporter layers along the height of the plurality of lower electrodes.

9. The method of claim 1, wherein forming the plurality of capacitors comprises:

forming a first mold oxide layer on the surface of the semiconductor substrate;

forming a supporter layer on the surface of the first mold oxide layer;

forming line type patterns by patterning the supporter layer to elongate the line type patterns in rows and columns, the frame being integrally connected to each end of the line type patterns for forming supporters;

forming a second mold oxide layer on the line type patterns, the frame, and the first mold oxide layer;

etching the second mold oxide layer, the line type patterns, and the first mold oxide layer to expose a conductive region formed on the semiconductor substrate, thereby forming a plurality of storage node holes arranged in rows and columns and forming the supporters between the storage node holes by etching the line type patterns;

forming lower electrodes on the inner walls of the storage node holes so that the lower electrodes connect to the supporters;

removing the second mold oxide layer; and removing the first mold oxide layer from regions outside of the frame.

10. The method of claim 9, wherein the supporter layer comprises a material having an etch rate that is different from the etch rates of the first and second mold oxide layers.

11. The method of claim 9, wherein the following is performed after etching the second mold oxide layer:

widening respective ones of the plurality of storage node holes;

wet cleaning inner walls of the storage node holes to expose ends of the respective supporters arranged between respective ones of the plurality of storage node holes.

12. The method of claim 9, further comprising:

forming a conductive layer for forming the plurality of lower electrodes on the resultant structure having the storage node holes;

forming an oxide layer on the resultant structure having the conductive layer so as to fill the storage node holes;

planarizing and removing the oxide layer and the conductive layer on the second mold oxide layer until the upper surface of the second mold oxide layer is exposed; and removing the oxide layer and the second and first mold oxide layers by wet etching.

13. The method of claim 9 wherein forming the first mold oxide layer, forming the supporter layer, and forming the line type patterns are repeated to form multiple supporter layers along the height of the plurality of lower electrodes.

14. The method of claim 1, wherein the plurality of lower electrodes is formed after forming the supporters, frame supporter, and frame.

15. The method of claim 1, wherein the supporters and the plurality of lower electrodes comprise materials that adhere to each other.

16. The method of claim 1, wherein the supporters comprise silicon nitride and the plurality of lower electrodes comprise doped polysilicon.

17. The method of claim 1, wherein forming the supporters comprises:

forming a first layer of supporters connecting adjacent ones of the plurality of lower electrodes; and forming a second layer of supporters connecting adjacent ones of the plurality of lower electrodes.

* * * * *